United States Patent
Marr et al.

(10) Patent No.: US 9,645,972 B2
(45) Date of Patent: May 9, 2017

(54) BUTTERFLY CHANNELIZER

(71) Applicant: Raytheon Company, Waltham, MA (US)

(72) Inventors: Harry B. Marr, Manhattan Beach, CA (US); Daniel Thompson, Hermosa Beach, CA (US)

(73) Assignee: RAYTHEON COMPANY, Waltham, MA (US)

( * ) Notice: Subject to any disclaimer, the term of this patent is extended or adjusted under 35 U.S.C. 154(b) by 245 days.

(21) Appl. No.: 14/320,839

(22) Filed: Jul. 1, 2014

(65) Prior Publication Data

US 2015/0363359 A1 Dec. 17, 2015

Related U.S. Application Data

(60) Provisional application No. 62/012,669, filed on Jun. 16, 2014.

(51) Int. Cl.
  *G06F 17/14* (2006.01)
  *H03H 17/02* (2006.01)
  *H04B 1/00* (2006.01)

(52) U.S. Cl.
  CPC ....... *G06F 17/142* (2013.01); *H03H 17/0213* (2013.01); *H03H 17/0248* (2013.01); *H04B 1/001* (2013.01)

(58) Field of Classification Search
  CPC .............................................. H03H 17/0213
  See application file for complete search history.

(56) References Cited

U.S. PATENT DOCUMENTS

| | | |
|---|---|---|
| 2,989,744 A | 6/1961 | Pettit |
| 3,170,158 A | 2/1965 | Rotman |
| 3,720,952 A | 3/1973 | Lawsine |
| 3,992,099 A | 11/1976 | Laughlin |
| 4,328,496 A | 5/1982 | White |
| 4,613,863 A | 9/1986 | Mitchell |
| 5,032,839 A | 7/1991 | Even-Or |

(Continued)

FOREIGN PATENT DOCUMENTS

| | | |
|---|---|---|
| CA | 1229926 A1 | 12/1987 |
| CN | 101241535 A | 8/2008 |

(Continued)

OTHER PUBLICATIONS

Balakrishnan et al., "Implementation of radix-2 and split-radix fast fourier transform algorithm using current mirrors", 2013 International Conference on Circuits, Power and Computing Technologies (ICCPCT), IEEE, Mar. 20, 2013, pp. 730-735.

(Continued)

*Primary Examiner* — Andrew Caldwell
*Assistant Examiner* — Calvin M Brien
(74) *Attorney, Agent, or Firm* — Cantor Colburn LLP

(57) ABSTRACT

A butterfly channelizer includes at least two stages. Each stage includes at least one dual-channel module configured to convert an input time domain signal into a second time domain signal of lower bandwidth. At least one clock is configured to generate a clock signal that drives the at least two stages. A first stage has a first number of dual-channel modules and a second stage following the first stage has a second number of dual-channel modules greater than the first number.

17 Claims, 4 Drawing Sheets

(56) References Cited

U.S. PATENT DOCUMENTS

| | | | |
|---|---|---|---|
| 5,717,620 | A | 2/1998 | Williams |
| 6,091,704 | A * | 7/2000 | Butash .............. H03H 17/0266 370/210 |
| 6,104,346 | A | 8/2000 | Rudish |
| 6,181,740 | B1 * | 1/2001 | Yasuda ................. H03D 3/006 375/232 |
| 6,222,409 | B1 | 4/2001 | Kieda |
| 6,285,197 | B2 | 9/2001 | Walker et al. |
| 6,898,235 | B1 | 5/2005 | Carlin et al. |
| 7,801,228 | B2 | 9/2010 | Lehne et al. |
| 8,578,256 | B2 | 11/2013 | Graef |
| 2001/0011893 | A1 | 8/2001 | Walker et al. |
| 2001/0022811 | A1 | 9/2001 | Lillington |
| 2003/0112904 | A1 * | 6/2003 | Fuller ................. H04B 1/7093 375/350 |
| 2003/0133524 | A1 | 7/2003 | Miller et al. |
| 2004/0189384 | A1 | 9/2004 | Kemna et al. |
| 2007/0223607 | A1 | 9/2007 | Lehne et al. |
| 2007/0223754 | A1 | 9/2007 | Roeck |
| 2009/0163161 | A1 | 6/2009 | Robinson et al. |
| 2010/0315292 | A1 | 12/2010 | Cui |
| 2011/0103430 | A1 | 5/2011 | Witrisal |
| 2011/0260911 | A1 | 10/2011 | Sapp |
| 2011/0274222 | A1 | 11/2011 | Hinson |
| 2014/0105416 | A1 | 4/2014 | Huttunen et al. |
| 2014/0210666 | A1 | 7/2014 | Maltsev et al. |
| 2014/0241463 | A1 | 8/2014 | Leenaerts et al. |
| 2015/0234030 | A1 | 8/2015 | Marr |

FOREIGN PATENT DOCUMENTS

| | | |
|---|---|---|
| EP | 0344794 A2 | 12/1989 |
| EP | 1596220 B1 | 11/2005 |
| EP | 2425635 A1 | 8/2013 |
| EP | 2728770 A2 | 5/2014 |
| EP | 2779473 A2 | 9/2014 |
| FR | 2689249 A1 | 10/1993 |
| GB | 2308034 A | 6/1997 |
| KR | 20080020078 A | 3/2008 |
| WO | 9306502 A1 | 4/1993 |
| WO | 9939517 A3 | 10/1999 |
| WO | 0011823 A1 | 3/2000 |
| WO | 0041340 A1 | 7/2000 |
| WO | 2005050241 A3 | 6/2005 |
| WO | 2012024507 A2 | 2/2012 |

OTHER PUBLICATIONS

International Search Report and Written Opinion; International Application No. PCT/US2015/016298; International Filing Date: Feb. 18, 2015; Date of Mailing: May 11, 2015; 14 pages.

Suh et al., "Low-Power Discrete Fourier Transform for OFDM: A Programmable Analog Approach", IEEE Transactions on Circuits and Systems I: Regular Papers, IEEE, vol. 58, No. 2, Feb. 1, 2011, pp. 290-298.

Chang et al., "Reconfigurable Architectures for Low Complexity Software Radio Channelizers using Hybrid Filter Banks," 10th IEEE Singapore International Conference on Communication systems, Oct. 2006, pp. 1-5.

Darak et al., "A reconfigurable filter bank for uniform and non-uniform channelization in multi-standard wireless communication receivers," IEEE 17th International Conference on Telecommunications (ICT), Apr. 4-7, 2010, pp. 951-956.

Lillington, "The pipelined frequency transform (PFT)", RF Engines, Electronic Engineering, Jun. 17, 2002, pp. 1-5.

Mahesh et al., "Reconfigurable low area complexity filter bank architecture based on frequency response masking for nonuniform channelization in software radio receivers", IEEE Transactions on Aerospace and Electronic Systems, vol. 47, No. 2, Apr. 2011, pp. 1241-1255.

Navarro et al. "Non-uniform channelization methods for next generation SDR PMR base stations", 2011 IEEE Symposium on Computers and Communications, Jul. 2011, pp. 620-625.

Sju, "Pipelined Frequency Transform PFT", RF Engines Limited Data Sheet, Apr. 29, 2002, pp. 1-25.

Smitha et al., "A new low power reconfigurable decimation interpolation and masking based filter architecture for channel adaptation in cognitive radio handsets," Physical Communication, 2, Jan. 2009, pp. 47-57.

Akpa et al., "N-parallel filter bank equivalent to tree structure", Electrical and Computer Engineering Conference Proceedings, 1994, pp. 494-496.

International Search Report and Written Opinion; PCT Application No. PCT/US2015/025537; International Filing Date: Apr. 13, 2015; Mailing Date: Jul. 28, 2015; 12 pages.

Lillington, "Flexible channelisation architectures for Software Defined Radio front ends using a Tuneable Pipelined Frequency Transform", IET Seminar Digest, vol. 2003, No. 1, 2003, pp. 1-13.

International Search Report and Written Opinion; International Application No. PCT/US2015/033207; International Filing Date: May 29, 2015; Date of Mailing: Sep. 17, 2015; 11 pages.

Ahnstrom et al., "Detection and direction-finding of spread spectrum signals using correlation and narrowband interference rejection", Proc. Nordic Matlab Conference, Copenhagen, Denmark, 2003, 5 pages.

Holler et al. "A 2-20-GHz Analog Lag Correlator for Radio Interferometry", IEEE Transactions on Instrumentation and Measurement, vol. 61, No. 8, Aug. 2012, pp. 2253-2261.

Houghton et al., "Direction finding on spread-spectrum signals using the time-domain filtered cross spectral density", IEEE Proceedings of Radar, Sonar and Navigation, vol. 144, No. 6, Dec. 1997, pp. 315-320.

Lambrecht et al., "True-Time-Delay Beamforming With a Rotman-Lens for Ultrawideband Antenna Systems", IEEE Transactions on Antennas and Propagation, vol. 58, No. 10, Oct. 2010, pp. 3189-3195.

Lehne et al., "A 0.13-um 1-GS/s CMOS Discrete-Time FFT Processor for Ultra-Wideband OFDM Wireless Receivers", IEEE Transactions on Microwave Theory and Techniques, vol. 59, No. 6, Jun. 2011, pp. 1639-1650.

Zhang et al., "Reconfigurable beam forming using phase-aligned Rotman lens", www.ietdl.org, The Institute of Engineering and Technology, 2012, pp. 326-330.

PCT International Search Report and Written Opinion; International Application No. PCT/US2015/039877; International Filing Date: Jul. 10, 2015; Date of Mailing: Oct. 6, 2015; 12 pages.

Mahesh et al., "Coefficient decimation approach for realizing reconfigurable finite impulse response filters," IEEE International Symposium on Circuits and Systems, ISCAS, May 18-21, 2008, pp. 81-84.

* cited by examiner

BUTTERFLY CHANNELIZER

CROSS-REFERENCE TO RELATED APPLICATIONS

This application claims priority to U.S. provisional application No. 62/012,669, filed Jun. 16, 2014, the disclosure of which is incorporated by reference herein in its entirety.

BACKGROUND

Hardware implementations for wideband systems cannot keep up with demanding bandwidth requirements. Therefore, a channelizer may be used to reduce a signal band into a plurality of sub-bands. Each of the sub-bands can then be processed on parallel channels.

Conventional channelizer circuits are designed to operate on static channels and are defined at compile time. It may be desirable, however, to rely on a channelizer capable of operating on dynamic channels to react in real-time to a changing radio frequency (RF) environment. For example, an object (e.g., a threat) to be detected can effectively hop center frequencies, and may thereby at least temporarily elude detection. Furthermore, the object or threat might only be detectable for short periods of time (e.g., a so-called pop-up or pulse object/threat).

Conventional signal processing applications typically rely on digital channelizers to decimate an incoming RF signal into frequency channels and provide filter shaping. Digital channelizers, however, typically utilize a field-programmable gate array (FPGA). Therefore, digital channelizers may fail to capture such pop-up or pulse objects/threats.

SUMMARY

According to one embodiment, a butterfly channelizer includes at least two stages. Each stage includes at least one dual-channel module configured to convert an input time domain signal into a second time domain signal of lower bandwidth. At least one clock is configured to generate a clock signal that drives the at least two stages. A first stage has a first number of dual-channel modules and a second stage following the first stage has a second number of dual-channel modules greater than the first number.

According to another embodiment, a method of channelizing an input time domain signal using a butterfly channelizer includes converting an input time domain signal into a plurality of corresponding second time domain signals of lower bandwidth using at least two stages. The method includes generating at least one clock signal, and generating a first number of output channels from a first stage in response to the clock signal. The method further includes generating a second number of output channels greater than the first number from a second stage following the first stage.

Additional features are realized through the techniques of the present invention. Other embodiments and aspects of the invention are described in detail herein and are considered a part of the claimed invention. For a better understanding of the invention with the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
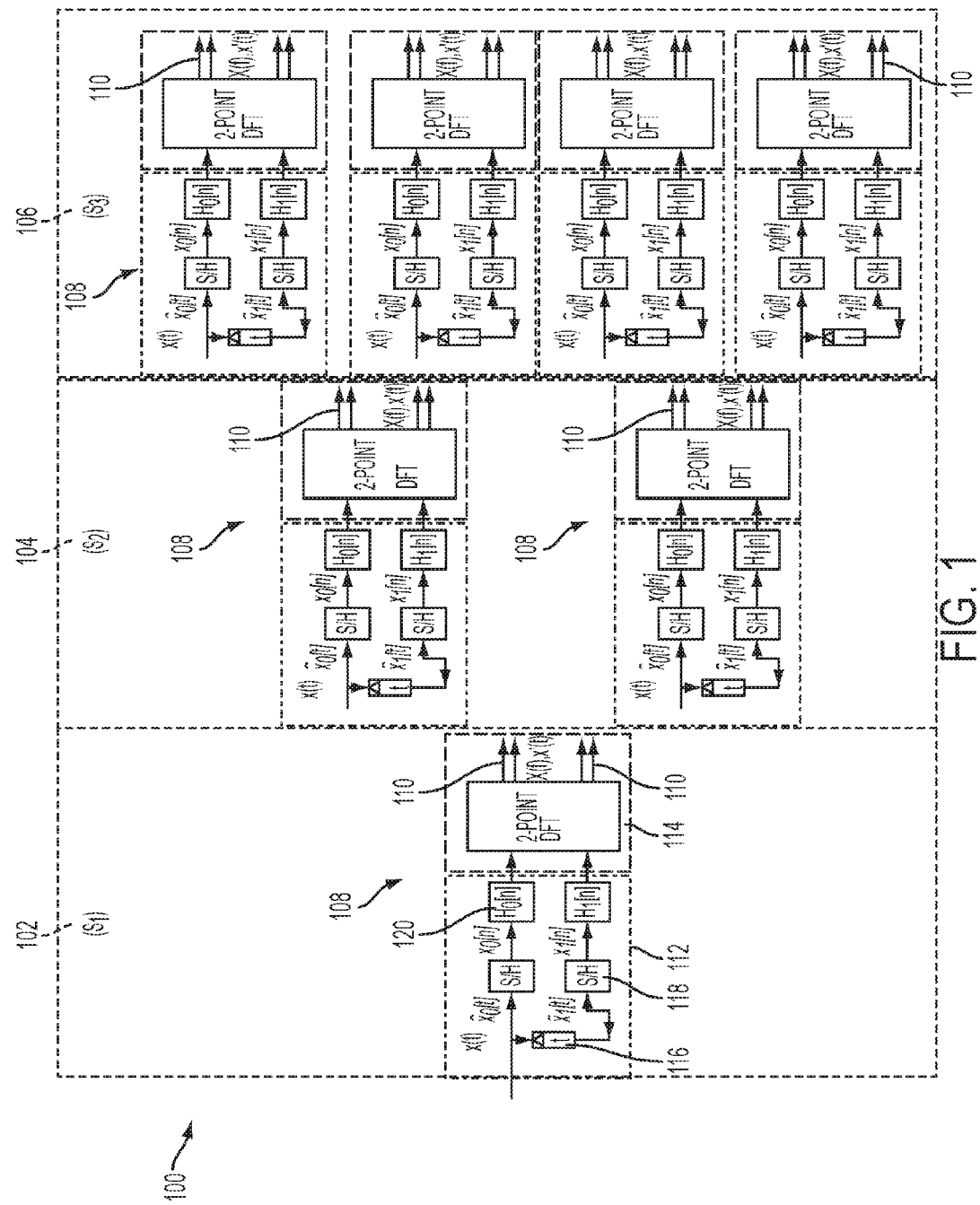
FIG. 1 is a schematic diagram of a butterfly channelizer according to an exemplary embodiment.

It is noted that various connections are set forth between elements in the following description and in the drawings (the contents of which are included in this disclosure by way of reference). It is noted that these connections in general and, unless specified otherwise, may be direct or indirect and that this specification is not intended to be limiting in this respect. In this respect, a coupling between entities may refer to either a direct or an indirect connection.

Disclosed herein are exemplary embodiments of apparatuses, systems, and methods describing a butterfly channelizer having a circuit architecture that is dynamically reconfigurable across a wideband spectrum. The butterfly channelizer of the present disclosure is capable of optimizing the channelizer structure to allow peak frequency and power efficient operation. The butterfly architecture described in the instant disclosure also provides extremely stable clocking due to a front end "master stage" that stabilizes the clock for all further stages. In some embodiments, the architecture may include one or more polyphase decimating FIR filters to down sample and filter the incoming signal, and one or more Fourier transform (FT) configurations to align the signals and bring each channel to baseband. Various embodiments can also include only a single clock for all time domains based on the division of the channels (e.g., based on dividing the channels in half). The outputs of each stage can be individually tapped to dynamically reconfigure different channel bandwidths and/or the number of channels. That is, a first output from a first stage ($s_n$) can be tapped to widen the bandwidth with respect to a second output from a second higher stage ($s_{n+1}$). The butterfly channelizer architecture of the instant disclosure is therefore configured to dynamically provide peak frequency and power efficient operation.

Referring now to FIG. 1, a butterfly channelizer 100 is illustrated according to an exemplary embodiment. The butterfly channelizer 100 includes a first stage ($s_1$) 102, a second stage ($s_2$) 104, and a third stage ($s_3$) 106. Although three stages are illustrated, it is appreciated that the butterfly channelizer 100 can include any number (n) of stages (i.e., $s_1$, $s_2$, $s_3$, $s_n$). Each stage 102-106 includes at least one electronic dual-channel module 108 that generates a pair of electronic output signals. Each output signal included in the pair may include a single signal having a real component (Q), or a pair of signals including a real component (Q) and an imaginary component (I). The output signals generated from each respective dual-channel module 108 define a respective channel 110.

According to the non-limiting embodiment illustrated in FIG. 1, each subsequent stage ($s_{n+1}$) includes n×2 dual-channel modules 108. Accordingly, a butterfly architecture is formed which provides an increased number of channels 110 as more stages ($s_n$) are added to a preceding stage of the butterfly channelizer 100. Although the butterfly channelizer 100 illustrated in FIG. 1 is constructed according to a $s_n \times 2$ butterfly architecture (i.e., $s_1=1$ dual-channel module 108, $s_2=2$ dual channel modules, $s_3=4$ dual channel modules), the butterfly architecture may be constructed according to other butterfly architectures such as, for example, a $s_n \times 3$ butterfly architecture (i.e., $s_1=1$ dual-channel module 108, $s_2=3$ dual channel modules, $s_3=9$ dual channel modules). Although FIG. 1 illustrates population of all stages included in the butterfly channelizer 100, another embodiment can provide a feature where butterfly channelizer 100 includes partially populated stages. That is, at least one first stage is fully populated, while at least one second stage is partially populated.

As further illustrated in FIG. 1, the dual-channel modules 108 transform an input time domain data signal x(t) into a time domain signal having a lower bandwidth at baseband and an increasing signal to noise ratio. According to an embodiment, the signal is always at baseband time domain after the first stage and each successive stage following the first stage has successively smaller bandwidth. In this manner, each successive stage takes in baseband and outputs baseband. Accordingly, the input signals and the output signals are in the time domain at every stage.

The input time domain data signal x(t) includes, but is not limited to, an analog time domain data signal and/or a digital time domain data signal. The input time domain data signal x(t) can also be a continuous data signal or discrete data signal, and can have a high-frequency operating in the $K_u$ frequency band. The $K_u$ frequency band may range, for example, from approximately 12 gigahertz (GHz) to approximately 18 GHz. Each dual-channel module 108 includes a filter unit 112 and a Fourier transform unit 114.

The filter unit 112 is constructed, for example, as a polyphase decimating finite impulse response (FIR) filter 112. The FIR filter 112 is configured to down-sample and filter the input time domain signal x(t) that is input to a respective dual-channel module 108. According to an embodiment, the FIR filter 112 includes a time delay element 116, a down-converter 118, and a polyphase filter branch element 120. The time delay element 116 serves to delay the samples associated with the time domain signal. The output of each time delay element 116 is provided to a respective down-converter 118. The down-converters 118 can be implemented for example, as a sample-and-hold (S/H) unit. The output of each down-converter 118 is provided to a respective polyphase filter branch unit 120. The polyphase filter branch units 120 can be constructed, for example, as a low pass filter (LPF) to remove high frequency components which may be indicative of noise.

The Fourier transform unit 114 executes a Fourier transform algorithm that aligns the output frequency domain signals x(f) and brings each signal to baseband to generate the respective channels 110 of a respective dual-channel module 108. The Fourier transform unit 114 may apply various Fourier transform algorithms to the signals received from a respective filter unit including, but not limited to, a discrete Fourier transform (DFT) algorithm and a fast Fourier transform (FFT) algorithm.

Figure 2:
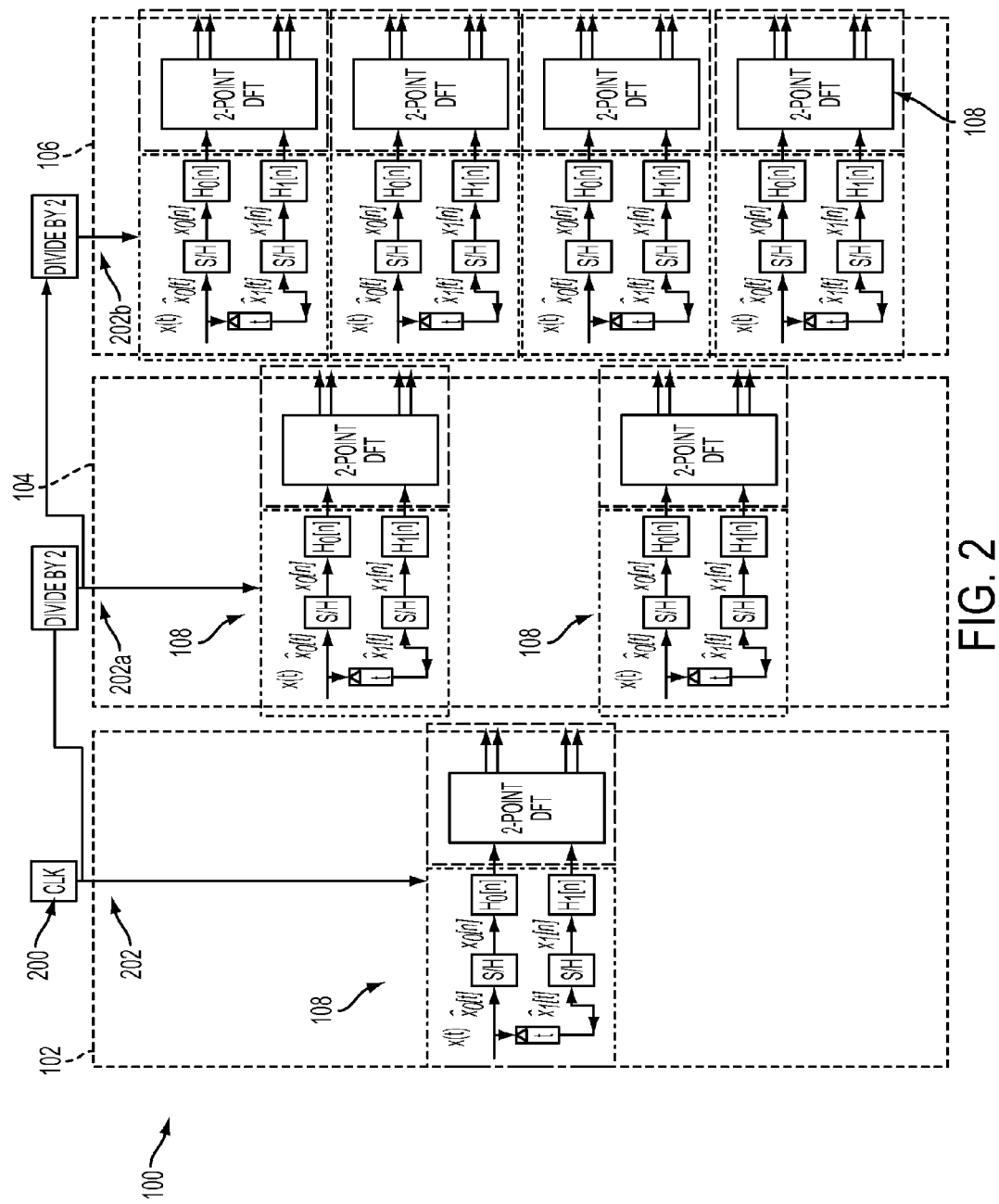
FIG. 2 is a schematic diagram of a butterfly channelizer including only a single clock to drive each stage for all time domains.

Turning to FIG. 2, a schematic diagram of a butterfly channelizer 100 that includes a clock stabilization scheme is illustrated according to an exemplary embodiment. The butterfly channelizer 100 includes a first stage 102, a second stage 104, and a third stage 106. The stages 102-106 are arranged according to a $s_n \times 2$ butterfly architecture (i.e., $s_1=1$ dual-channel module 108, $s_2=2$ dual channel modules, $s_3=4$ dual channel modules). The butterfly channelizer 100 further includes a single clock 200 (i.e., a master clock 200) that outputs a master clock signal 202 to drive all the stages 102-106. The master clock signal 202 output to stages 104-106, however, is divided by two with respect to the clock signal applied to a previous stage (i.e., $s_n-1$). Various devices may be used to divide the main clock signal 202 as understood by those ordinarily skilled in the art. Thus, the second stage 104 receives clock signal 202a, which is the main clock signal divided by 2, and the third stage 106 receives clock signal 202b, which is clock signal 202a divided by 2 (i.e., the main clock signal 202 divided by 4). It is appreciated that the first stage 102 receives the undivided main clock signal 202 directly from the master clock 200 since no stage precedes the first stage 102. The implementation of a single master clock 202, therefore, stabilizes the overall clocking of the butterfly channelizer 100 since a single master clock signal 202 is utilized to ultimately drive all the stages 102-106.

Although a single master clock 200 is discussed in terms of the $s_n \times 2$ butterfly architecture illustrated in FIG. 2, a single master clock 200 may be used with a butterfly channelizer 100 arranged according to other butterfly architectures described by the present disclosure. For example, a single master clock 200 may be implemented in a $s_n \times 3$ butterfly architecture. In this arrangement, however, the master clock signal 202 output to stages 104-106 is divided by three with respect to the clock signal applied to the previous stage.

Figure 3:
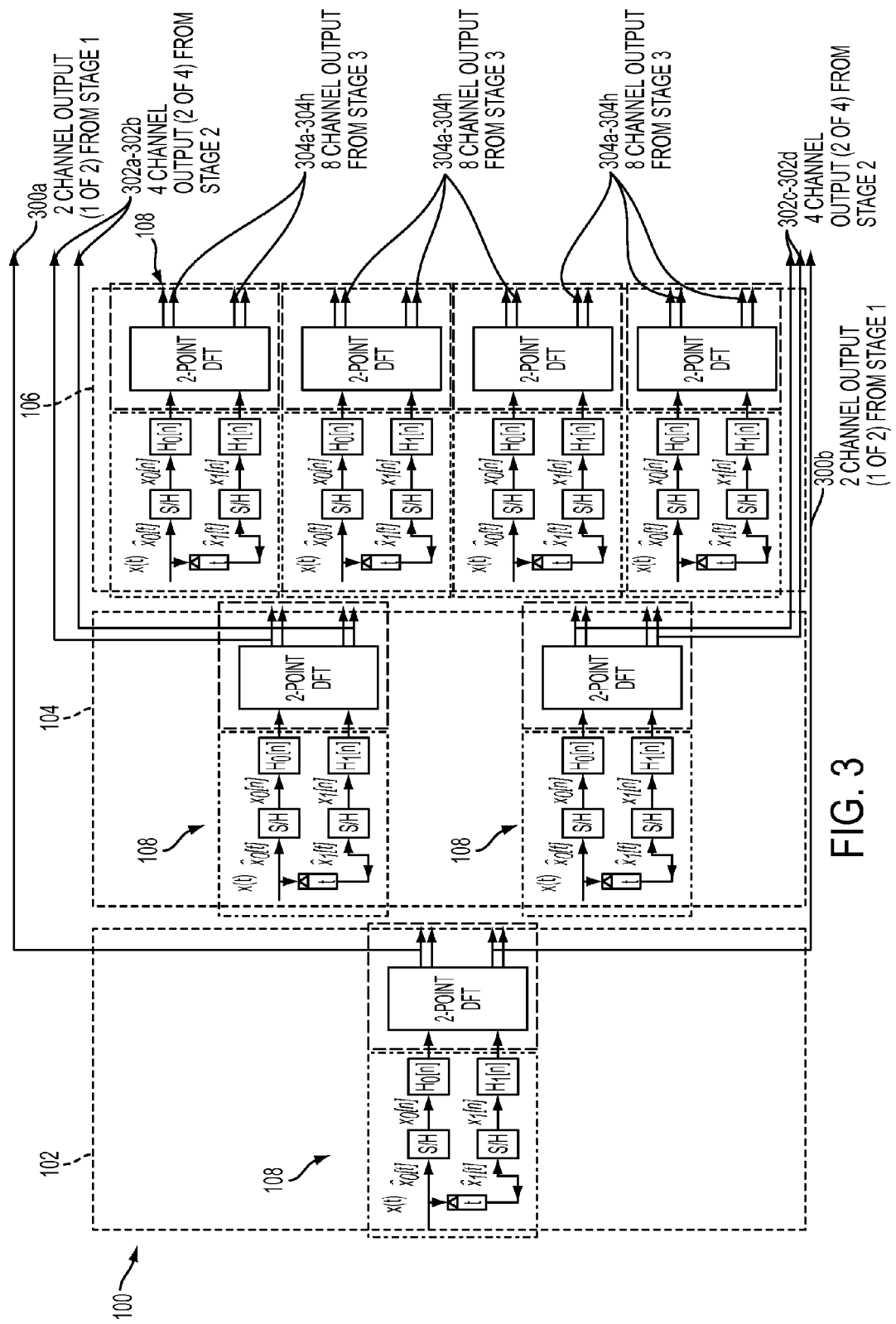
FIG. 3 is a schematic diagram of a butterfly channelizer including dynamically reconfigurable outputs according to an exemplary embodiment.

Referring now FIG. 3, a schematic diagram illustrates an exemplary embodiment of a butterfly channelizer 100 including channel outputs that are dynamically reconfigurable. The butterfly channelizer 100 includes a first stage 102, a second stage 104, and a third stage 106. Although not shown for sake of clarity, a single master clock 200 may be included to drive the stages 102-106. As discussed with reference to FIG. 2, the first stage 102 may receive the master clock signal 202, the second stage 104 receives clock signal 202a (i.e., half of the master clock signal 202), and the third stage 106 receives clock signal 202b (i.e., half of signal 202b).

Since a single master clock 200 drives the stages 102-106, the bandwidths of the respective output channels can be varied. More specifically, each individual stage 102-106 can be selectively tapped to provide respective channel outputs having varying bandwidths. For example, the first stage 102 generates 2 channel outputs 300a-300b, the second stage generates 4 channel outputs 302a-302d, and the third stage generates 8 channel outputs 304a-304h. In this manner, the outputs of each stage 102-106 can be individually tapped to dynamically reconfigure the butterfly channelizer 100 and obtain different channel bandwidths and/or the number of total channel outputs provided by the butterfly channelizer 100. That is, the output from the first stage 102 can be tapped to widen the bandwidth of the channels outputs 300a-300b with respect to the channel outputs 302a-302d and/or 304a-304h of the higher stages 104-106.

Figure 4:
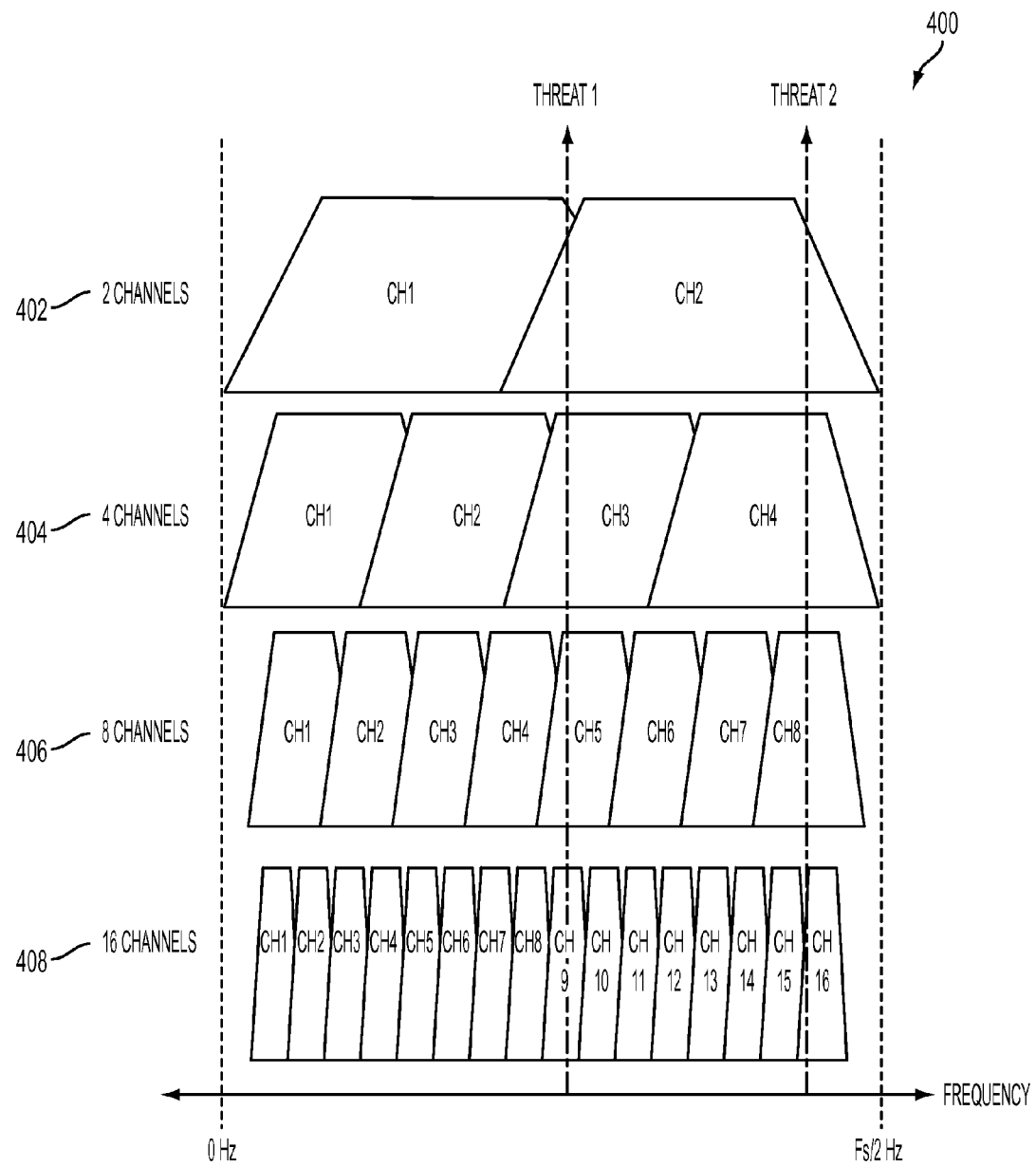
FIG. 4 depicts an embodiment used to illustrate a system for responding to one or more threats.

Turning to FIG. 4, a system 400 for responding to two potential threats, denoted as Threat 1 and Threat 2 is shown. The system 400 can adjust the channel outputs associated with the butterfly channelizer architecture of the present disclosure as described further below. Threat 1 and Threat 2 may be dynamic in nature in the sense that one or both of them may be configured to modify one or more of their own operational parameters (e.g., modulation scheme, bandwidth, frequency, amplitude, etc.). According to at least one embodiment, a plurality of the parameters are simultaneously modified.

For purposes of illustration, the butterfly channelizer architecture is initially configured with two channels (CH1 and CH2) as shown via reference character 402. Threat 1 and Threat 2 may be detected using configuration 402. Although two threats are described, it is appreciated that the system 400 may be utilized to detect more or less threats Threat 1 and Threat 2, however, may elude detection using configuration 402, given that Threat 1 and Threat 2 are on the channel edges of the two channels. In addition, the use of only two channels may provide for a relatively low signal-to-noise ratio (SNR).

According, to an embodiment, the system 400 can be dynamically configured to provide configuration 404. The use of configuration 404 may represent an improvement relative to the configuration 402 in detecting Threat 1 and Threat 2. Accordingly, the system 400 constructed according to the butterfly channelizer architecture of the present disclosure can be dynamically reconfigured by tapping the output of different stages. Accordingly, the configuration 404 can be dynamically obtained, which may include the use of four channels (CH1-CH4). In this manner, the system 400 achieved by the butterfly channelizer architecture is dynamically reconfigured to improve the SNR relative to the configuration 402. However, configuration 404 may once again place Threat 1 and Threat 2 near channel boundaries.

In a similar manner as discussed above, the system 400 may again be dynamically reconfigured to obtain eight channel outputs by tapping the channel outputs of a higher stage. Using eight channels (CH1-CH8) as shown in configuration 406, Threat 2 may appear near the center of CH8 with an increase in SNR relative to any of configurations 402, and 404.

The system 400 can again be dynamically reconfigured to obtain sixteen channels as shown in configuration 408. Similar to the operations discussed above, using sixteen channels (CH1-CH16) may result in Threat 1 appearing near the center of CH9 with an increase in SNR relative to any of configurations 402, 404, and 406. Therefore, the system 400 may be dynamically reconfigured based on one or more realized threats.

One skilled in the art would appreciate that any number of algorithms may be used to decide whether, and to what extent, a given parameter associated with the channelizer architecture should be used or modified. Such algorithms may establish parameters for nodes as part of a mission planning phase. Alternatively, an executable control program may attempt to optimize a given parameter based on one or more inputs or conditions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A butterfly channelizer, comprising:
    at least two stages, each stage including at least one dual-channel module configured to convert an input time domain signal into a second time domain signal of lower bandwidth at baseband; and
    at least one clock configured to generate a clock signal that drives the at least two stages,
    wherein a first stage has a first number of dual-channel modules and a second stage following the first stage has a second number of dual-channel modules greater than the first number.

2. The butterfly channelizer of claim 1, wherein each stage among the at least two stages is selectively tapped to provide respective channel outputs.

3. The butterfly channelizer of claim 2, wherein the second stage has a greater number of output channels than the first stage.

4. The butterfly channelizer of claim 3, wherein the at least one clock comprises a single master clock configured to generate a master clock signal that is delivered to the first stage.

5. The butterfly channelizer of claim 4, wherein the master clock signal is divided to generate a second clock signal that is delivered to the second stage.

6. The butterfly channelizer of claim 5, wherein the output channels of the second stage have a narrower bandwidth than the output channels of the first stage.

7. The butterfly channelizer of claim 6, wherein the at least two stages includes first stage including a first number of dual-channel modules to define the first stage among the at least two stages, a second number of dual-channel modules that is twice the number of the first number to define the second stage among the at least two stages, and a third number of dual-channel modules that is twice the second number to define a third stage among the at least two stages.

8. The butterfly channelizer of claim 7, wherein the first stage has a plurality of first channel outputs having a first bandwidth, the second stage has a plurality of second channel outputs having a second bandwidth greater than the first bandwidth, and the third stage has a plurality of third channel outputs having a third bandwidth that is greater than the first and second bandwidths.

9. A method of channelizing an input time domain signal using a butterfly channelizer, the method comprising:
    converting an input time domain signal into a plurality of corresponding second time domain signals of lower bandwidth at baseband using at least two stages;
    generating at least one clock signal; and
    in response to the clock signal, generating a first number of output channels from a first stage and generating a second number of output channels greater than the first number from a second stage following the first stage,
    wherein converting the input time domain signal includes down-sampling, via analog sample-and-hold unit, the input time domain signal, filtering the input time domain signal, and increasing the signal to noise ratio of the down-sampled time domain signal to generate the second time domain signals and provide output channels of the at least two stages.

10. The method of claim 9, further comprising applying a discrete Fourier transform algorithm on the down-sampled time domain signal.

11. The method of claim 9, further comprising selectively tapping each stage among the at least two stages to provide respective channel outputs.

12. The method of claim 11, wherein the second stage has a greater number of output channels than the first stage.

13. The method of claim 12, further comprising generating a master clock signal that is delivered to the first stage.

14. The method of claim 13, further comprising dividing the master clock signal to generate a second clock signal that is delivered to the second stage.

15. The method of claim 14, wherein the output channels of the second stage have a narrower bandwidth than the output channels of the first stage.

16. The method of claim 15, wherein the at least two stages includes a first number of dual-channel modules to define a first stage among the at least two stages, a second number of dual-channel modules that is twice the number of the first number to define a second stage among the at least two stages, and a third number of dual-channel modules that is twice the second number to define a third stage among the at least two stages.

17. The method of claim 16, wherein the first stage has a plurality of first channel outputs having a first bandwidth, the second stage has a plurality of second channel outputs having a second bandwidth greater than the first bandwidth, and the third stage has a plurality of third channel outputs having a third bandwidth that is greater than the first and second bandwidths.

* * * * *